(12) United States Patent
Takata

(10) Patent No.: US 10,396,314 B2
(45) Date of Patent: Aug. 27, 2019

(54) MANUFACTURING METHOD FOR ORGANIC ELECTROLUMINESCENT PANEL AND ORGANIC ELECTROLUMINESCENT PANEL

(71) Applicant: JOLED INC., Tokyo (JP)

(72) Inventor: Masakazu Takata, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/810,436

(22) Filed: Nov. 13, 2017

(65) Prior Publication Data

US 2018/0138459 A1 May 17, 2018

(30) Foreign Application Priority Data

Nov. 16, 2016 (JP) .................. 2016-223363

(51) Int. Cl.
| | |
|---|---|
| *H01L 27/32* | (2006.01) |
| *H01L 51/00* | (2006.01) |
| *H01L 51/50* | (2006.01) |
| *H01L 51/56* | (2006.01) |

(52) U.S. Cl.
CPC .......... *H01L 51/56* (2013.01); *H01L 51/0005* (2013.01); *H01L 51/0026* (2013.01); *H01L 51/0028* (2013.01); *H01L 27/3211* (2013.01); *H01L 51/005* (2013.01); *H01L 51/0052* (2013.01); *H01L 51/0065* (2013.01); *H01L 51/5012* (2013.01); *H01L 51/5056* (2013.01); *H01L 51/5072* (2013.01)

(58) Field of Classification Search
CPC . H01L 51/5278; H01L 51/56; H01L 51/5056; H01L 27/3246; H01L 27/3283; H01L 27/3295
See application file for complete search history.

(56) References Cited

U.S. PATENT DOCUMENTS

| | | | |
|---|---|---|---|
| 2012/0193619 A1* | 8/2012 | Taka | H01L 51/5278 257/40 |
| 2017/0062719 A1* | 3/2017 | Sakai | H01L 51/0005 |
| 2017/0309691 A1* | 10/2017 | Madigan | H01L 27/3218 |

FOREIGN PATENT DOCUMENTS

JP 2010-257668 A 11/2010

* cited by examiner

*Primary Examiner* — Changhyun Yi
(74) *Attorney, Agent, or Firm* — Chip Law Group

(57) ABSTRACT

There is provided a manufacturing method for an organic electroluminescent panel that includes an organic electroluminescent element for each sub-pixel. The manufacturing method includes an application step of recoating a first organic material layer and a second organic material layer, which include principal components common to each other, to manufacture the organic electroluminescent element. At the application step, after the first organic material layer is applied, an insolubilization process is performed for the first organic material layer to provide a change to a structure of molecules included in the first organic material layer, and the second organic material layer is applied to the first organic material layer after the insolubilization process is performed.

12 Claims, 11 Drawing Sheets

F I G . 6
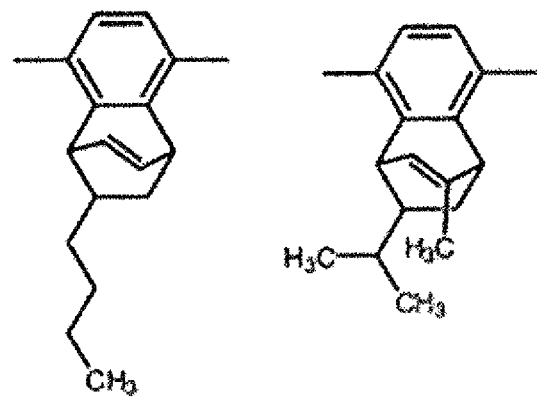
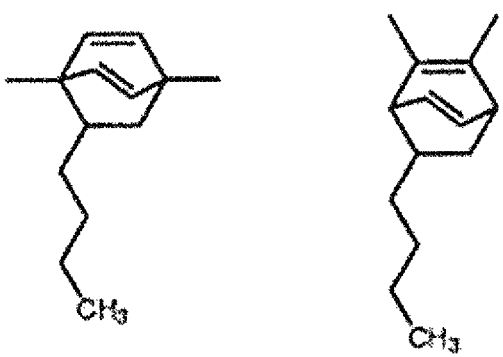

MANUFACTURING METHOD FOR ORGANIC ELECTROLUMINESCENT PANEL AND ORGANIC ELECTROLUMINESCENT PANEL

CROSS REFERENCE TO RELATED APPLICATIONS

This application claims priority benefit of Japanese Patent Application No. JP 2016-223363 filed in the Japan Patent Office on Nov. 16, 2016. Each of the above-referenced applications is hereby incorporated herein by reference in its entirety.

BACKGROUND

The present disclosure relates to a manufacturing method for an organic electroluminescent panel and an organic electroluminescent panel.

A method of manufacturing an organic electroluminescent panel by forming an organic electroluminescent element for each pixel using an ink jet device is known. Together with increase of the definition in recent years, the pixel size has decreased and the liquid retention amount per unit area has decreased. However, it is difficult to excessively increase the ink density from a point of view of the solubility or printable physical properties (viscosity and so forth). Therefore, in the invention disclosed in Japanese Patent Laid-Open No. 2010-257668 (hereinafter referred to as Patent Document 1), it is proposed to perform recoating by a plural number of times.

SUMMARY

Incidentally, if recoating is performed by a plural number of times, then a layer applied already dissolves into the ink recoated next. Since this dissolution locally occurs only in the proximity of a location at which a liquid droplet of the ink has landed, the film thickness at the location at which the liquid droplet of the ink has landed decreases locally. Especially, where a line bank in which ink is flowable between pixels is used, the film thickness unevenness spans a plurality of pixels and is viewed as streaky luminance unevenness. Therefore, it is desirable to provide a manufacturing method for an organic electroluminescent panel and an organic electroluminescent panel by which streaky luminance unevenness can be suppressed.

According to one embodiment of the present disclosure, there is provided a manufacturing method for an organic electroluminescent panel that includes an organic electroluminescent element for each sub-pixel, the manufacturing method including an application step of recoating a first organic material layer and a second organic material layer, which include principal components common to each other, to manufacture the organic electroluminescent element, in which, at the application step, after the first organic material layer is applied, an insolubilization process is performed for the first organic material layer to provide a change to a structure of molecules included in the first organic material layer, and the second organic material layer is applied to the first organic material layer after the insolubilization process is performed.

The organic electroluminescent panel in one embodiment of the present disclosure includes an organic electroluminescent element for each sub-pixel. The organic electroluminescent element is configured including a hole transport layer, an organic light emitting layer and an electron transport layer. The hole transport layer, the organic light emitting layer or the electron transport layer has a first organic material layer and a second organic material layer that are stacked one on the other and include principal components common to each other.

In the manufacturing method for an organic electroluminescent panel according to the embodiment of the present disclosure, after an insolubilization process that provides a change to the structure of molecules included in the first organic material layer is performed for the applied first organic material layer, the second organic material layer is applied. Consequently, the first organic material layer becomes less liable to dissolve by the second organic material layer.

In the organic electroluminescent panel of the embodiment of the present disclosure, the hole transport layer, the organic light emitting layer or the electron transport layer has the first organic material layer and the second organic material layer that are stacked one on the other and include principal components common to each other. Consequently, for example, after the insolubilization process that provides a change to the structure of molecules included in the first organic material layer is performed for the applied first organic material layer, the second organic material layer can be applied. Consequently, the first organic material layer can be made less liable to dissolve by the second organic material layer.

With the manufacturing method for an organic electroluminescent panel according to the embodiment of the present disclosure, since the first organic material layer is made less liable to dissolve by the second organic material layer, streaky luminance unevenness can be suppressed. It is to be noted that the advantageous effect of the present disclosure is not limited to the advantageous effect described here but may be any advantageous effect described herein.

With the organic electroluminescent panel according to the embodiment of the present disclosure, since the first organic material layer is made less liable to dissolve by the second organic material layer, streaky luminance unevenness can be suppressed. It is to be noted that the advantageous effect of the present disclosure is not limited to the advantageous effect described here but may be any advantageous effect described herein.

The above and other objects, features and advantages of the present invention will become apparent from the following description and the appended claims, taken in conjunction with the accompanying drawings in which like parts or elements denoted by like reference characters.

BRIEF DESCRIPTION OF THE DRAWINGS

FIG. 6 is a view depicting examples of a molecular structure of an organic material having an insolubilizing group;

DETAILED DESCRIPTION OF THE PREFERRED EMBODIMENT

Figure 1:
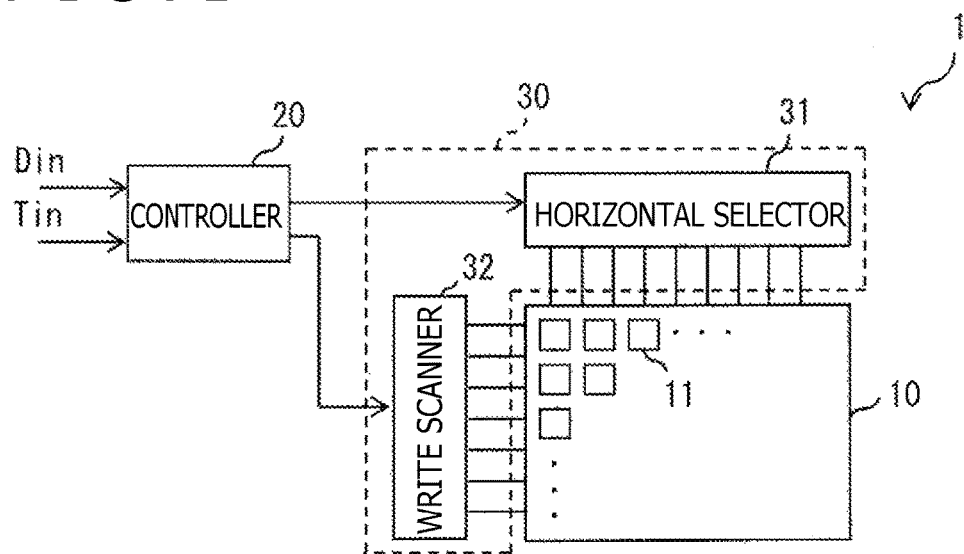
FIG. 1 is a block diagram depicting an organic electroluminescent apparatus according to an embodiment of the present disclosure.

In the following, a mode for carrying out the present disclosure is described in detail with reference to the drawings. The embodiment described below is a preferred form of the present disclosure. Accordingly, numerical values, shapes, materials, components, locations and connection states of the components and so forth indicated in the embodiment described below are a mere example and are not restrictive of the present disclosure. Therefore, from among the components in the embodiment described below, components that are not described in the independent claims of the generic concept of the present disclosure are described as arbitrary components. It is to be noted that figures in the drawings are schematic views and are not necessarily depicted strictly. Further, in the figures, substantially like elements are denoted by like reference symbols, and overlapping description of them is omitted or simplified.

<Embodiment>

[Configuration]

Figure 2:
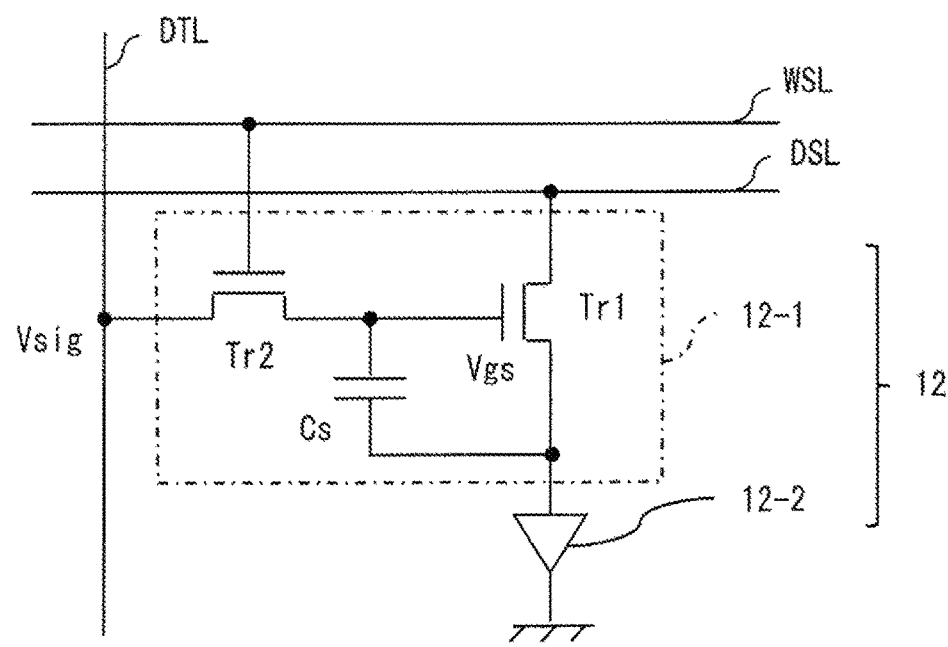
FIG. 2 is a circuit diagram depicting an example of a circuit configuration of a sub-pixel included in each pixel depicted in FIG. 1.

FIG. 1 is a view depicting an example of a general configuration of an organic electroluminescent apparatus 1 according to an embodiment of the present disclosure. FIG. 2 is a view depicting an example of a circuit configuration of each pixel 11 provided in the organic electroluminescent apparatus 1. The organic electroluminescent apparatus 1 includes, for example, an organic electroluminescent panel 10, a controller 20 and a driver 30. The driver 30 is mounted, for example, at an outer edge portion of the organic electroluminescent panel 10. The organic electroluminescent panel 10 includes a plurality of pixels 11 arranged in a matrix. The controller 20 and the driver 30 drive the organic electroluminescent panel 10 based on a video signal Din and a synchronizing signal Tin inputted from the outside.

(Organic Electroluminescent Panel 10)

The organic electroluminescent panel 10 displays an image based on the video signal Din and the synchronizing signal Tin inputted from the outside by active matrix driving of the pixels 11 by the controller 20 and the driver 30. The organic electroluminescent panel 10 has a plurality of scanning lines WSL extending in a row direction, a plurality of signal lines DTL and a plurality of power supply lines DSL extending in a column direction, and the plurality of pixels 11 arranged in a matrix.

The scanning lines WSL are used for selection of the pixels 11 and provide, to the pixels 11, selection pulses for selecting the pixels 11 for each predetermined unit (for example, for each pixel row). The signal lines DTL are used to supply a signal voltage Vsig according to the video signal Din to the pixels 11 and supply a data pulse including the signal voltage Vsig to the pixels 11. The power supply lines DSL supply power to the pixels 11.

Each pixel 11 includes, for example, a sub-pixel 12 that emits red light, another sub-pixel 12 that emits green light and a further sub-pixel 12 that emits blue light. It is to be noted that each pixel 11 may be configured including a further sub-pixel 12 or sub-pixels 12 for emitting some other color or colors (for example, white, yellow or the like).

Each signal line DTL is connected to an output terminal of a horizontal selector 31 hereinafter described. To the pixel columns, for example, a plurality of signal lines DTL are allocated one by one. Each scanning line WSL is connected to an output terminal of a write scanner 32 hereinafter described. To the pixel rows, for example, a plurality of scanning lines WSL are allocated one by one. Each power supply line DSL is connected to an output terminal of the power supply. To the pixel rows, for example, a plurality of power supply lines DSL are allocated one by one.

Each sub-pixel 12 has a pixel circuit 12-1 and an organic electroluminescent element 12-2. The configuration of the organic electroluminescent element 12-2 is hereinafter described in detail.

The pixel circuit 12-1 controls emission/non-emission of light of the organic electroluminescent element 12-2. The pixel circuit 12-1 has a function for holding a voltage written in each sub-pixel 12 by write scanning hereinafter described. The pixel circuit 12-1 is configured, for example, including a driving transistor Tr1, a write transistor Tr2 and a holding capacitor Cs.

The write transistor Tr2 controls application of a signal voltage Vsig corresponding to the video signal Din to the gate of the driving transistor Tr1. In particular, the write transistor Tr2 samples the voltage of the signal line DTL and writes the voltage obtained by the sampling to the gate of the driving transistor Tr1. The driving transistor Tr1 is connected in series to the organic electroluminescent element 12-2. The driving transistor Tr1 drives the organic electroluminescent element 12-2. The driving transistor Tr1 controls current flowing to the organic electroluminescent element 12-2 in response to the magnitude of the voltage sampled by the write transistor Tr2. The holding capacitor Cs holds a predetermined voltage between the gate and the source of the driving transistor Tr1. The holding capacitor Cs has a role of holding the gate-source voltage Vgs of the driving transistor Tr1 to a fixed level within a predetermined period. It is to be noted that the pixel circuit 12-1 may have a circuit configuration in which various capacitors or transistors are added to the circuit of two transistors and one capacitor or may have a circuit configuration different from the circuit configuration just described.

Each signal line DTL is connected to an output terminal of the horizontal selector 31 hereinafter described and the source or the drain of the write transistor Tr2. Each scanning line WSL is connected to an output terminal of the write scanner 32 hereinafter described and the gate of the write transistor Tr2. Each power supply line DSL is connected to the power supply circuit and the source or the drain of the driving transistor Tr1.

The write transistor Tr2 is connected at the gate thereof to the scanning line WSL. The write transistor Tr2 is connected at the source or the drain thereof to the signal line DTL. The write transistor Tr2 is connected, at one of the source and the drain thereof which is not connected to the signal line DTL, to the gate of the driving transistor Tr1. The driving transistor Tr1 is connected at the source or the drain thereof to the power supply line DSL. The driving transistor Tr1 is connected, at one of the source and the drain thereof which is not connected to the power supply line DSL, to the anode 21 of the organic electroluminescent element 21-2. The holding capacitor Cs is connected at one end thereof to the gate of the driving transistor Tr1. The holding capacitor Cs is connected at the other end thereof to the terminal at the organic electroluminescent element 21-2 side from between the source and the drain of the driving transistor Tr1.
(Driver 30)

The driver 30 includes, for example, the horizontal selector 31 and the write scanner 32. The horizontal selector 31 applies an analog signal voltage Vsig inputted from the controller 20 to each signal line DTL, for example, in response to (in synchronism with) an input of a control signal. The write scanner 32 scans a plurality of sub-pixels 12 for each predetermined unit.
(Controller 20)

Now, the controller 20 is described. The controller 20 performs predetermined correction for a digital video signal Din inputted, for example, from the outside, and generates a signal voltage Vsig on the basis of a video signal obtained by the correction. The controller 20 outputs, for example, the generated signal voltage Vsig to the horizontal selector 31. The controller 20 outputs a control signal to the circuits in the driver 30 in response to (in synchronism with) the synchronizing signal Tin inputted, for example, from the outside.

Figure 3:
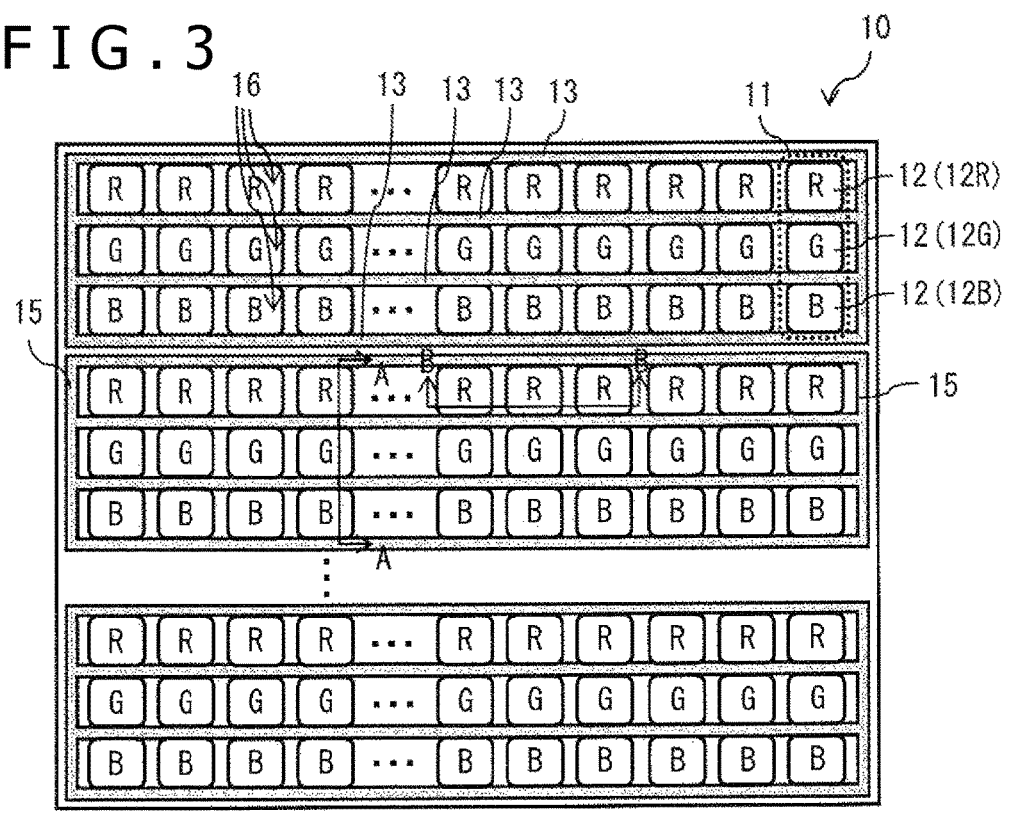
FIG. 3 is a view depicting an example of a general configuration of an organic electroluminescent panel depicted in FIG. 1.
Figure 4:
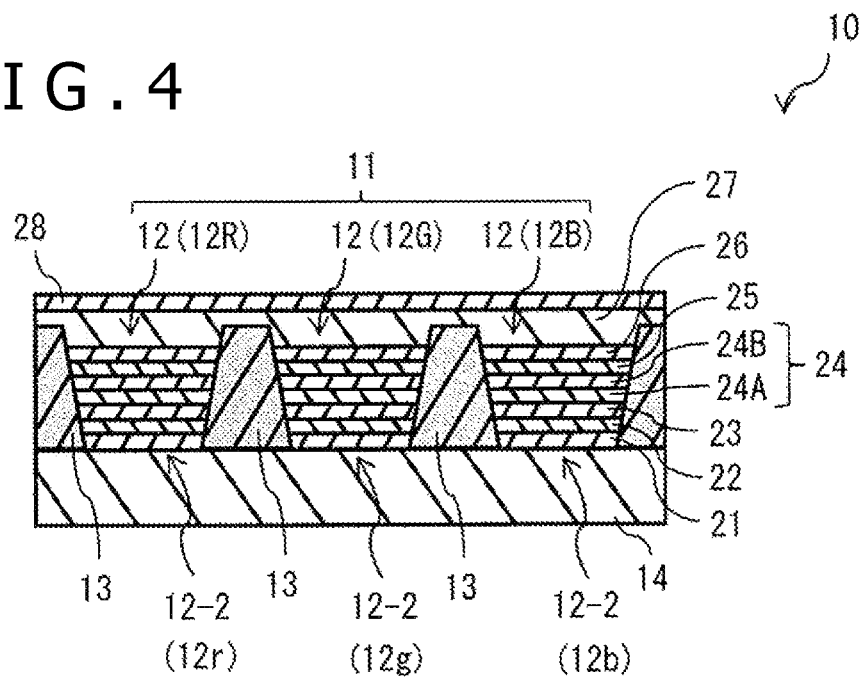
FIG. 4 is a view depicting an example of a sectional configuration taken along line A-A of the organic electroluminescent panel of FIG. 3.
Figure 5:
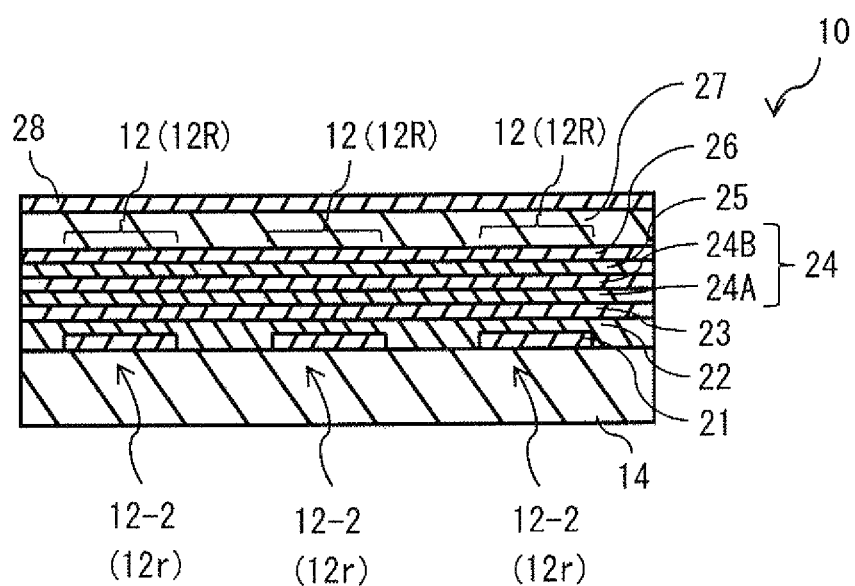
FIG. 5 is a view depicting an example of a sectional configuration taken along line B-B of the organic electroluminescent panel of FIG. 3.

Now, the organic electroluminescent elements 12-2 are described with reference to FIGS. 3, 4 and 5. FIG. 3 depicts an example of a general configuration of the organic electroluminescent panel 10. FIG. 4 depicts an example of a sectional configuration taken along line A-A of the organic electroluminescent panel 10 of FIG. 3. FIG. 5 depicts an example of a sectional configuration taken along line B-B of the organic electroluminescent panel 10 of FIG. 3.

The organic electroluminescent panel 10 includes a plurality of pixels 11 arranged in a matrix. As described hereinabove, each pixel 11 includes a sub-pixel 12 (12R) that emits red light, another sub-pixel 12 (12G) that emits green light, and a further sub-pixel 12 (12B) that emits blue light. The sub-pixel 12R is configured including an organic electroluminescent element 12-2 (12r) that emits light of red. The sub-pixel 12G is configured including an organic electroluminescent element 12-2 (12g) that emits light of green. The sub-pixel 12B is configured including a further organic electroluminescent element 12-2 (12b) that emits blue light. The sub-pixels 12R, 12G and 12B are arrayed, for example, in a stripe array. In each pixel 11, for example, the sub-pixels 12R, 12G and 12B are disposed in a juxtaposed relationship in the column direction. Further, in each pixel row, for example, sub-pixels 12 that emit light of the same color are disposed in a juxtaposed relationship in the row direction.

The organic electroluminescent panel 10 includes a plurality of line banks 13 extending in the row direction on a substrate 14. The organic electroluminescent panel 10 further includes a plurality of banks 15 on the substrate 14 such that they connect end portions of the plurality of line banks 13 to each other. Each bank 15 extends in the column direction. The substrate 14 is configured, for example, from a base member that supports the organic electroluminescent elements 12-2, line banks 13 and so forth thereon, and a wiring line layer provided on the base member. The base member in the substrate 14 is formed, for example, from alkali-free glass, soda glass, non-fluorescent glass, phosphate glass, nitric acid type glass, quartz or the like. The base member in the substrate 14 is formed, for example, from acrylic resin, styrene glass, polycarbonate resin, epoxy resin, polyethylene, polyester, silicone resin, alumina or the like. In the wiring line layer in the substrate 14, for example, a pixel circuit 12-1 in each pixel 11 is formed.

The line banks 13 and the banks 15 are formed, for example, from insulating organic material. As the insulating organic material, for example, acrylic resin, polyimide resin, novolak type phenolic resin and so forth are available. The line banks 13 and the banks 15 are preferably formed from insulating resin having heat resistance and resistance to solvent. The line banks 13 and the banks 15 are formed, for example, by processing insulating material into desired patterns by photolithography and development. The cross sectional shape of each line bank 13 may be such a forwardly tapering shape as depicted in FIG. 4 or a reversely tapering shape having a reduced hem.

A region surrounded by two line banks 13 positioned adjacent each other and extending in parallel to each other and banks 15 at the opposite ends of the line banks 13 forms a grooved portion 16. In each sub-pixel 12, one organic electroluminescent element 12-2 is arranged in a gap between two line banks 13 that are positioned adjacent each other and extend in parallel to each other. In other words, in each sub-pixel 12, the organic electroluminescent elements 12-2 are arranged one by one in each grooved portion 16. The gap between two line banks 13 that are positioned adjacent each other and extend in parallel to each other (width D1 of the grooved portion 16) has a dimension, for example, equal to or smaller than 50 µm. The gap between two line banks 13 that are positioned adjacent each other and extend in parallel to each other (width D1 of the grooved portion 16) has such a size that, for example, where the RGB sub-pixels 12 are arrayed in a stripe array, the definition is equal to or higher than 150 ppi.

Each organic electroluminescent element 12-2 includes, for example, an anode 21, a hole injection layer 22, a hole transport layer 23, an organic light emitting layer 24, an electron transport layer 25, an electron injection layer 26 and a cathode 27 in order from the substrate 14 side. The hole injection layer 22 is a layer for increasing the hole injection efficiency. The hole transport layer 23 is a layer for transporting holes injected from the anode 21 to the organic light emitting layer 24. The organic light emitting layer 24 is a layer that emits light of a predetermined color by recombination of electron and hole. The electron transport layer 25 is a layer for transporting electrons injected from the cathode 27 to the organic light emitting layer 24. The electron injection layer 26 is a layer for increasing the electron injection efficiency. At least one of the hole injection layer 22 and the electron injection layer 26 may be omitted. The organic electroluminescent element 12-2 may have an additional layer or layers to the layers mentioned above.

The anode 21 is formed, for example, on the substrate 14. The anode 21 is a transparent electrode having a light transmission property, and for the anode 21, a transparent conductive film made of transparent conductive material such as, for example, ITO (Indium Tin Oxide) or IZO (Indium Zinc Oxide) is used. It is to be noted that the anode 21 is not limited to a transparent electrode but may be made of, for example, aluminum (Al), silver (Ag), alloy of aluminum or silver or the like or may be a reflective electrode having reflectivity. The anode 21 may otherwise be a stack of a reflective electrode and a transparent electrode.

The hole transport layer 23 has a function for transporting holes injected from the anode 21 to the organic light emitting layer 24. The hole transport layer 23 is, for example, an applied film. The hole transport layer 23 is formed, for example, by applying and drying solution in which organic material having a hole transporting property (hereinafter referred to as "hole transporting material 23M") is a principal component of solute. The hole transport layer 23 is configured including the hole transporting material 23M as a principal component. The hole transport layer 23 has, for example, a function for insolubilizing at least one of the hole transport layer 23 and a component other than the hole transporting material 23M. The function for insolubilizing signifies a function by which an insolubilizing group such as a thermally dissociable soluble group, a crosslinkable group or a removable protecting group chemically changes by heat, irradiation of ultraviolet rays or the like or a combination of them to decrease the solubility in organic or water. Accordingly, where the hole transport layer 23 includes a material having an insolubilizing group in at least one of the hole transport layer 23 and a component other than the hole transport layer 23, the hole transport layer 23 is a hole transport layer for which an insolubilization process has been performed. The insolubilization is evaluated, for example, by the residual film ratio. The insolubilizing group is hereinafter described in detail.

The hole transport layer 23 may be a vapor deposited film. In this case, the hole transport layer 23 is formed, for example, by vapor depositing the hole transporting material 23M.

The hole transporting material 23M that is a raw material (material) of the hole transport layer 23 is, for example, an arylamine derivative, a triazole derivative, an oxadiazole derivative, an imidazole derivative, a polyarylalkane derivative, a pyrazoline derivative and a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a hydrazone derivative, a triphenylmethane derivative, a tetraphenyl benzine derivative or the like or a combination of them. The hole transporting material 23M further has, in a molecular structure thereof, a soluble group and an insolubilizing group such as a thermally dissociable soluble group, a crosslinkable group or a removable protecting group, for example, in order to achieve functions for solubility and insolubilization.

The organic light emitting layer 24 has a function for emitting light of a predetermined color by recombination of holes and electrons. The organic light emitting layer 24 is an applied film. The organic light emitting layer 24 is formed by applying and drying solution that contains organic material that generates excitons to emit light by recombination of holes and electrons (hereinafter referred to as "organic light emitting material 24M") as a principal component of solute. The organic light emitting layer 24 is configured containing the organic light emitting material 24M as a principal component. In an organic electroluminescent element 12r included in the sub-pixel 12R, the organic light emitting layer 24 is configured including an organic red light emitting material. In an organic electroluminescent element 12g included in the sub-pixel 12G, the organic light emitting layer 24 is configured including an organic green light emitting material. In an organic electroluminescent element 12b included in the sub-pixel 12B, the organic light emitting material 24M is configured including an organic blue light emitting material.

In the organic light emitting layer 24, for example, at least one of the organic light emitting material 24M and a component other than the organic light emitting material 24M has an insolubilizing function. Accordingly, where the organic light emitting layer 24 contains a material having an insolubilizing group in at least one of the organic light emitting material 24M and a component other than the organic light emitting material 24M, the organic light emitting layer 24 is an organic light emitting layer for which an insolubilization process has been performed.

The organic light emitting layer 24 is configured, for example, from a plurality of stacked organic light emitting layers. The organic light emitting layer 24 includes, for example, an organic light emitting layer 24A and another organic light emitting layer 24B in which the principal components are common to each other and which are stacked in this order from the hole transport layer 23 side as depicted in FIGS. 4 and 5. The organic light emitting layer 24 has, for example, an organic light emitting layer 24A and an organic light emitting layer 24B stacked on each other and having a common principal component. Each of the organic light emitting layer 24A and the organic light emitting layer 24B is an applied layer. Both the organic light emitting layer 24A and the organic light emitting layer 24B are formed by applying and drying of solution in which the organic light emitting material 24M is a principal component of solute. Both the organic light emitting layer 24A and the organic light emitting layer 24B are configured including the organic light emitting material 24M as a principal component thereof. Both the organic light emitting layer 24A and the organic light emitting layer 24B are formed, for example, by applying a common ink.

At least one of the organic light emitting layer 24A and the organic light emitting layer 24B (in particular, the organic light emitting layer 24A) has an insolubilizing function (material having an insolubilizing group), for example, in at least one of the organic light emitting material 24M and a component other than the organic light emitting material 24M. Accordingly, the layer having the insolubilizing function from between the organic light emitting layer 24A and the organic light emitting layer 24B is an organic light emitting layer for which an insolubilization process has been performed.

Although the organic light emitting material 24M that is a raw material (material) of the organic light emitting layer 24 may solely be, for example, a dopant material, and more preferably, a combination of a host material and a dopant material is used. In short, the organic light emitting layer 24 is configured including a host material and a dopant material as the organic light emitting material 24M. The host material is principally responsible for the function for charge transportation of electrons or holes, and the dopant material is responsible for the function of light emission. Each of the host material and the dopant material is not limited to one kind of material but may be a combination of two or more kinds of materials. The amount of the dopant material preferably is equal to or greater than 0.01% in weight but equal to or smaller than 30% in weight with respect to the host material, and more particularly is equal to or higher than 0.01% in weight but equal to or smaller than 10% in weight.

As the host material of the organic light emitting layer 24, for example, an amine compound, a condensed polycyclic aromatic compound or a heterocycle compound is used. As the amine compound, for example, a monoamine derivative, a diamine derivative, a triamine derivative or a tetraamine derivative is used. As the condensed polycyclic aromatic compound, for example, an anthracene derivative, a naphthalene derivative, a naphthacene derivative, a phenanthrene derivative, a chrysene derivative, a fluoranthene derivative, a triphenylene derivative, a pentacene derivative, a perylene derivative and so forth are available. As the heterocycle compound, for example, a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, azacarbazole, a pyrazoline derivative, a pyrazolone derivative, a phthalocyanine derivative and so forth are available.

Meanwhile, as the dopant material of the organic light emitting layer 24, for example, a pyrene derivative, a fluoranthene derivative, an arylacetylene derivative, a fluorene derivative, a perylene derivative, an oxadiazole derivative, an anthracene derivative or a chrysene derivative is used. Alternatively, as the dopant material of the organic light emitting layer 24, a metal complex may be used. As the metal complex, a complex including metal atoms of, for example, iridium (Ir), platinum (Pt), osmium (Os), gold (Au), rhenium (Re), ruthenium or the like and a ligand is available.

The organic light emitting layer 24 may be a vapor deposited film. In this case, the organic light emitting layer 24 is formed by vapor depositing the organic light emitting material 24M.

The electron transport layer 25 has a function for transporting electrons injected from the cathode 27 to the organic light emitting layer 24. The electron transport layer 25 is, for example, an applied film. The electron transport layer 25 is configured including an organic material having electron transportability (hereinafter referred to as "electron transporting material 25M") as a principal component.

The electron transport layer 25 is interposed between the organic light emitting layer 24 and the cathode 27 and has a function for transporting electrons injected from the cathode 27 to the organic light emitting layer 24. The electron transporting material 25M that is a raw material (material) of the electron transport layer 25 is an aromatic heterocyclic compound containing one or more hetero atoms in a molecule. As the aromatic heterocyclic compound, a compound that includes, for example, a pyridine ring, a pyrimidine ring, a triazine ring, a benzimidazole ring, a phenanthroline ring, a quinazoline ring or the like in the skeleton thereof is available. Further, the electron transport layer 25 may include a metal having electron portability. Where the electron transport layer 25 includes a metal having electron portability, the electron portability of the electron transport layer 25 can be improved. As the metal included in the electron transport layer 25, for example, barium (Ba), lithium (Li), calcium (Ca), potassium (K), cesium (Cs), sodium (Na), rubidium (RB) and so forth can be used.

The electron transport layer 25 has an insolubilizing function, for example, at least in one of the electron transport layer 25 and a component other than the electron transporting material 25M. Accordingly, where at least one of the electron transporting material 25M and a component other than the electron transporting material 25M of the electron transport layer 25 includes a material having an insolubilizing group, the electron transport layer 25 is an electron transport layer for which an insolubilization process has been performed.

The electron transport layer 25 may be a vapor deposited film. In this case, the electron transport layer 25 is formed, for example, by vapor depositing the electron transporting material 25M.

The cathode 27 is, for example, a reflection electrode having light reflectivity and is, for example, a metal electrode formed using a metal material having reflectivity. As the material of the cathode 27, for example, aluminum (Al), magnesium (Mg), silver (Ag), aluminum-lithium alloy, magnesium-silver alloy or the like is used. It is to be noted that the cathode 27 is not limited to a reflective electrode but may be a transparent electrode of an ITO film or the like similarly to the anode 21. Where the substrate 14 and the anode 21 have a light transmitting property and the cathode 27 has reflectivity, the organic electroluminescent element 12-2 has a bottom emission structure by which light is radiated from the substrate 14 side. Where the anode 21 has reflectivity and the cathode 27 has a light transmitting property, the organic electroluminescent element 12-2 has a top emission structure.

The organic electroluminescent panel 10 may further include, for example, a sealing layer 28 for sealing each organic electroluminescent element 12-2. The sealing layer 28 is provided in contact with the surface of the cathode 27 of each organic electroluminescent element 12-2.

(Insolubilizing Group)

Figure 7:
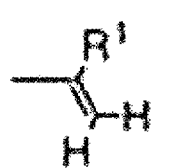
FIG. 7 is a view depicting different examples of a molecular structure of an organic material having an insolubilizing group.
Figure 7:
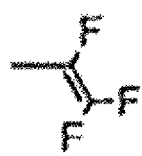
Figure 7:
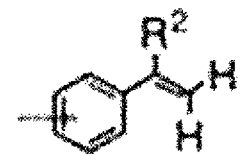
Figure 7:
Figure 7:
Figure 7:
Figure 7:
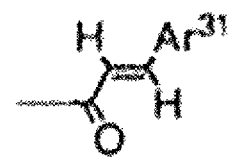
Figure 7:
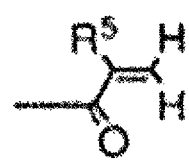
Figure 7:
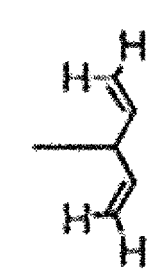
Figure 7:
Figure 7:
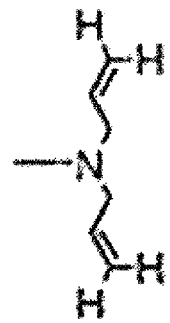

Now, the insolubilizing group described above is described. FIGS. 6 and 7 depict examples of a molecular structure of an organic material having an insolubilizing group. At least one of the hole transport layer 23, the organic light emitting layer 24 and the electron transport layer 25 is an applied film and contains a material having an insolubilizing group. The insolubilizing group is a thermally dissociable soluble group, a crosslinkable group or a removable protecting group.

(Thermally Dissociable Soluble Group)

The thermally dissociable soluble group is a group that is dissociated at a temperature equal to or higher than 70° C. from an aromatic hydrocarbon ring to which it is bonded, and shows solubility to solvent. Here, "to show solubility to solvent" signifies that, in a state before a compound reacts by irradiation of at least one of heat and an active energy ray, the compound dissolves by 0.1% in weight or more in toluene at a room temperature. The solubility of the compound in toluene preferably is 0.5% in weight or more, more preferably is 1% in weight or more. Such a thermally dissociable soluble group preferably is a group that thermally dissociates without forming a polar group at the aromatic carbon oxide ring side, and more preferably is a group that thermally dissociates by a Diels-Alder reaction. As the thermally dissociable soluble group, for example, such groups as illustrated in FIG. 6 can be listed. It is to be noted that the thermally dissociable soluble group is not limited to those illustrated in FIG. 6.

(Crosslinkable Group)

The crosslinkable group is a group that reacts, by irradiation of at least one of heat and an active energy ray, with a same or different group of a different molecule positioned in the proximity to generate a novel chemical bonds. The crosslinkable group is more preferably than the thermally dissociable soluble group or the removable protecting group in that a great difference can be provided in solubility to solvent across a reaction (insolubilizing reaction) that occurs by irradiation of at least one of heat and an active energy ray. As the crosslinkable group, for example, such groups as depicted in FIG. 7 are listed. It is to be noted that the crosslinkable group is not limited to those depicted in FIG. 7.

A group that indicates an insolubilizing reaction by cationic polymerization is preferable in that it has high reactivity and is easy in insolubilization. As a group that indicates an insolubilization reaction by cationic polymerization, for example, a cyclic ether group (for example, an epoxy group or an oxetane group), a vinyl ether group and so forth are available. An oxetane group is particularly preferable in that the rate of cationic polymerization can be controlled readily. A vinyl ether group is preferable in that a hydroxyl group that may possibly give rise to deterioration of an element upon cationic polymerization is less likely to be generated.

(Removable Protecting Group)

The removable protecting group is a group that brings about a molecular structure change by dissociation of the removable protecting group by a heat treatment. By dissociation of the removable protecting group, the solubility in organic solvent changes. A material having an amino group is used widely as a material for the hole transport layer 23 or the electron transport layer 25 of the organic electroluminescent element 12-2. As the removable protecting group, t-BOC (tert-butoxycarbonyl group), a benzoyl group, a benzylcarbonyl group, an allyloxycarbonyl group, a methoxymethyl group or the like is preferably used.

(Insolubilization)

The insolubilization can be performed, for example, by applying energy to material configuring an organic material layer, which is to be insolubilized, to crosslink at least part of the material. If coating solution containing such a material as described above is applied to form a film and then light or heat is applied as energy to the film to cause the film to crosslink, then the film can be insolubilized. It is to be noted that, in the present specification, the crosslink is a concept including also that low molecular weight crosslinking agents polymerize with one another. A material that principally configures an organic material layer to be insolubilized may crosslink by application of energy. Alternatively, at least part of the remaining part of a material configuring an organic material layer to be insolubilized other than a material that principally configures the organic material layer may crosslink by application of energy. The insolubilization can be performed also by a change in structure of a substituent itself by applying energy, for example, to a removable protecting group, a thermally dissociable soluble group or the like.

[Manufacturing Method]

Figure 8:
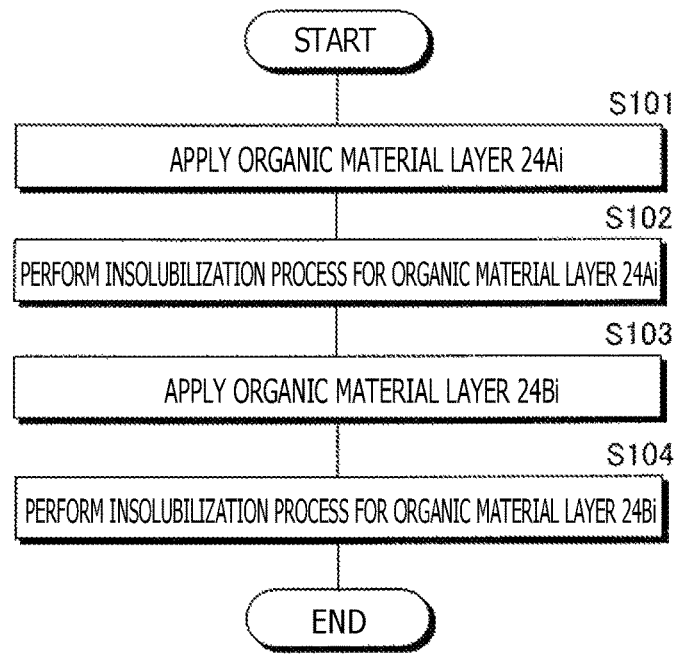
FIG. 8 is a view depicting an example of a manufacturing procedure of the organic electroluminescent panel of FIG. 4.

Now, a manufacturing method for the organic electroluminescent panel 10 is described. FIG. 8 depicts an example of a manufacturing procedure of the organic electroluminescent panel 10. FIGS. 9, 10, 11, 12, 13, 14 and 15 depict an example of steps in a manufacturing process of the organic electroluminescent panel 10.

Figure 9:
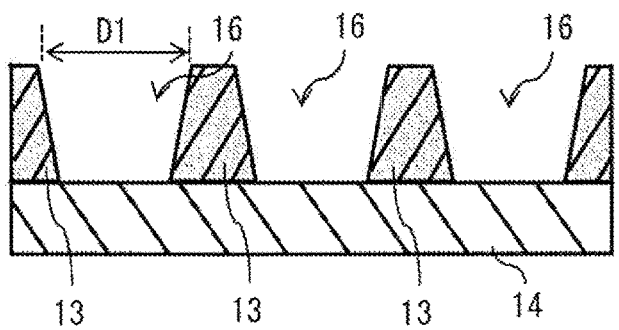
FIGS. 9, 10 and 11 are views depicting an example of steps in a manufacturing process of the organic electroluminescent panel of FIG. 4.

First, a plurality of line banks 13 and a plurality of banks 15 are formed on a substrate 14 (FIG. 9). Consequently, grooved portions 16 extending in a row direction are formed. The gap between two line banks 13 extending in parallel and positioned adjacent to each other (width D1 of the grooved portion 16) is set in response to the magnitude of the definition demanded for the organic electroluminescent panel 10. In order to set the definition equal to or higher than 150 ppi where the RGB sub-pixels 12 are arrayed in a stripe array, the gap between two line banks 13 extending in parallel and positioned adjacent to each other (width D1 of the grooved portion 16) is set to a magnitude equal to or smaller than 50 μm.

Figure 10:
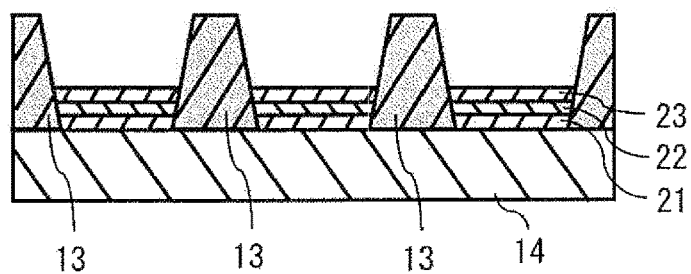

Then, an anode 21 is formed on the bottom of each grooved portion 16. Then, after liquid droplets of ink are discharged using, for example, an ink jet device, the ink after discharged is dried to form a hole injection layer 22 and a hole transport layer 23 (FIG. 10). Then, after liquid droplets of ink are discharged using, for example, an ink jet device, a liquid organic material layer 24Ai and another liquid organic material layer 24Bi in which principal components are common to each other are recoated. Both the organic material layer 24Ai and the organic material layer 24Bi are liquid organic material layers in which the organic light emitting material 24M is a principal component of solute. Both the organic material layer 24Ai and the organic material layer 24Bi are configured containing the organic light emitting material 24M as a principal component. Both the organic material layer 24Ai and the organic material layer 24Bi are configured from common ink. In at least the organic material layer 24Ai from between the organic material layer 24Ai and the organic material layer 24Bi, at least one of the organic light emitting material 24M and a component other than the organic light emitting material 24M contains a material having an insolubilizing group.

Figure 11:
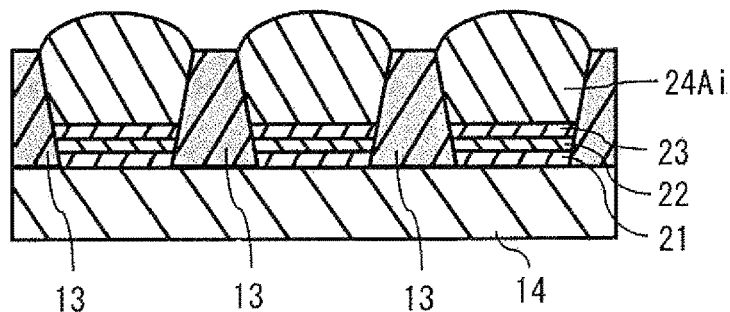
Figure 12:
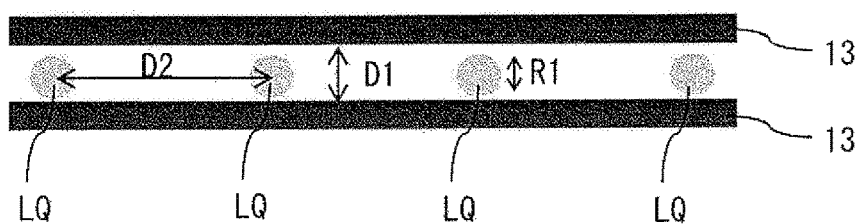
FIG. 12 is a view schematically depicting a manner when liquid droplets of ink are dropped.

In particular, the liquid organic material layer 24Ai that is a raw material of the organic light emitting layer 24A is applied in each grooved portion 16 (step S101, FIG. 11). At this time, from the ink jet device, liquid droplets LQ are dropped into the grooved portion 16 at discharge intervals D2 that are equal to or greater than twice the diameter R1 of the liquid droplets LQ as depicted in FIG. 12. In other words, the discharge interval D2 between liquid droplets is equal to or greater than twice the diameter R1 of the liquid droplets LQ. The discharge interval D2 is, for example, an equal interval with regard to all liquid droplets LQ dropped in the grooved portion 16. It is to be noted that the discharge interval D2 may be partially increased or decreased, for example, in the grooved portion 16.

Figure 13:
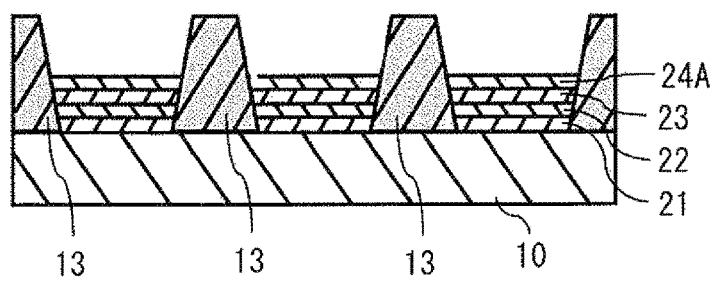
FIGS. 13, 14 and 15 are views depicting an example of steps following the steps depicted in FIGS. 9, 10 and 11.

Then, an insolubilization process is performed for the organic material layer 24Ai to provide a change in structure of molecules included in the organic material layer 24Ai (step S102). Consequently, as the solvent contained in the organic material layer 24Ai is volatilized and the structure of molecules included in the organic material layer 24Ai changes, the organic material layer 24Ai is insolubilized. As a result, an organic light emitting layer 24A is formed (FIG. 13). It is to be noted that, in the insolubilization process at step S102, a change may be provided to the structure of molecules included in the organic material layer 24Ai simultaneously with the volatilization of the solvent included in the organic material layer 24Ai. Alternatively, in the insolubilization process at step S102, a change may be provided to the structure of molecules included in the organic material layer 24Ai after the solvent included in the organic material layer 24Ai is volatilized.

Figure 14:
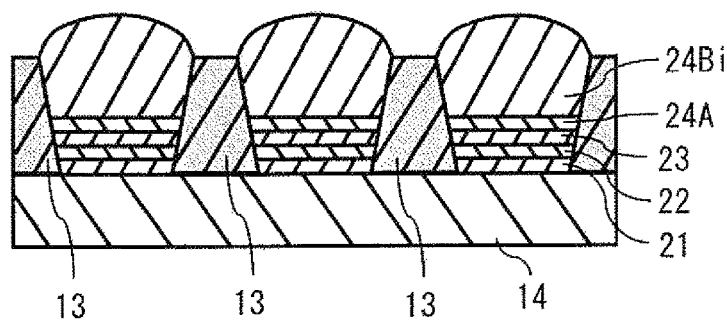

Thereafter, a liquid organic material layer 24Bi that is a raw material of the organic light emitting layer 24B is applied in the grooved portion 16 (step S103, FIG. 14). At this time, for example, as depicted in FIG. 12, liquid droplets LQ are dropped into the grooved portion 16 at discharge intervals D2, which are equal to or greater than twice the diameter R1 of the liquid droplets LQ, from the ink jet device. In other words, the interval D2 between liquid droplets is equal to or greater than twice the diameter R1 of the liquid droplets LQ. The discharge interval D2 is, for example, an equal interval in regard to all liquid droplets LQ dropped in the grooved portion 16. It is to be noted that the discharge interval D2 may be partially increased or decreased, for example, in the grooved portion 16.

Figure 15:
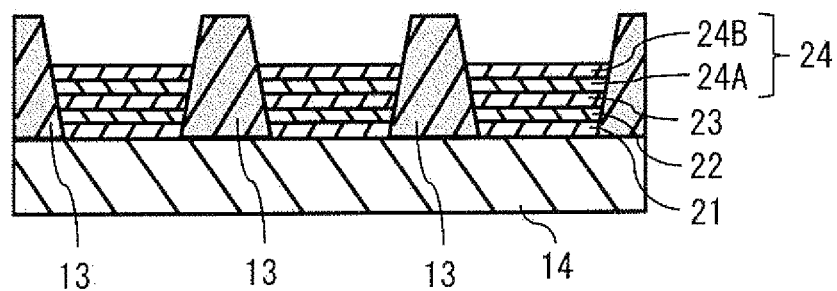

Thereafter, an insolubilization process is performed for the organic material layer 24Bi (step S104). Where the organic material layer 24Bi includes a material having an insolubilizing group, the insolubilization process provides a change to the structure of molecules included in the organic material layer 24Bi. As a result, as the solvent included in the organic material layer 24Bi is volatilized and the structure of molecules included in the organic material layer 24Bi changes, the organic material layer 24Bi is insolubilized. As a result, an organic light emitting layer 24B is formed (FIG. 15). It is to be noted that, in the insolubilization process at step S104, a change may be provided to the structure of molecules included in the organic material layer 24Bi simultaneously with the volatilization of the solvent included in the organic material layer 24Ai. Alternatively, in the insolubilization process at step S104, a change may be provided to the structure of molecules included in the organic material layer 24Bi after the solvent included in the organic material layer 24Bi is volatilized. Where the organic material layer 24Bi does not include a material having an insolubilizing group, a volatilization process is performed for the organic material layer 24Bi in place of an insolubilization process. As a result, an organic light emitting layer 24B is formed (FIG. 15).

Then, an electron transport layer 25 and an electron injection layer 26 are formed by drying, after liquid droplets of ink are discharged, for example, using an ink jet device, the ink after discharged. Then, a cathode 27 and a sealing layer 28 are formed in this order on the electron injection layer 26. An organic electroluminescent panel 10 having an organic electroluminescent element 12-2 for each sub-pixel 12 is manufactured in this manner.

[Advantageous Effects]

Now, advantageous effects of the manufacturing method of the organic electroluminescent panel 10 of the present embodiment are described in contrast to a comparative example.

A method is known in which an ink jet device is used to form an organic electroluminescent element for each pixel to manufacture an organic electroluminescent panel. Together with increase of the definition in recent years, the pixel size has decreased and the liquid retention amount per unit area has decreased. However, from the point of view of the solubility and printable physical properties (viscosity and so forth), it is difficult to excessively increase the ink density. Therefore, for example, in the invention disclosed in Patent Document 1, it is proposed to perform recoating by a plural number of times.

Figure 16A:
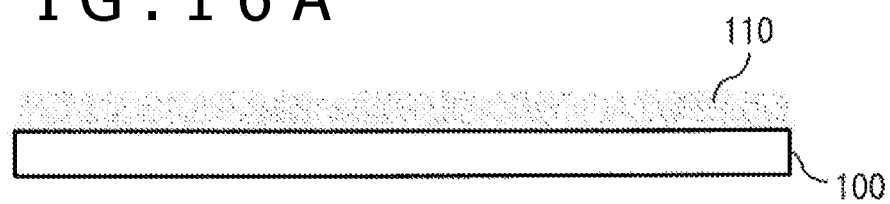
FIGS. 16A, 16B, 16C and 16D are views depicting an example of different steps of a manufacturing process of an organic material layer.
Figure 16B:
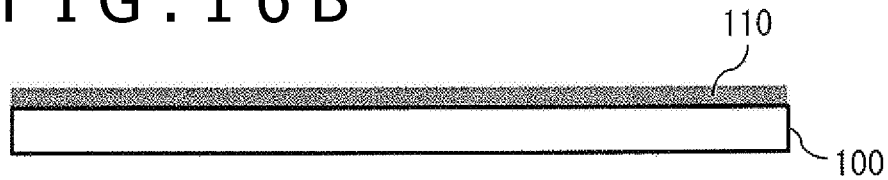
Figure 16C:
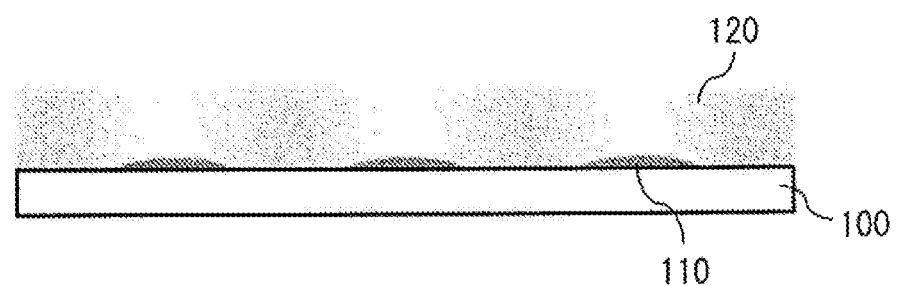
Figure 16D:
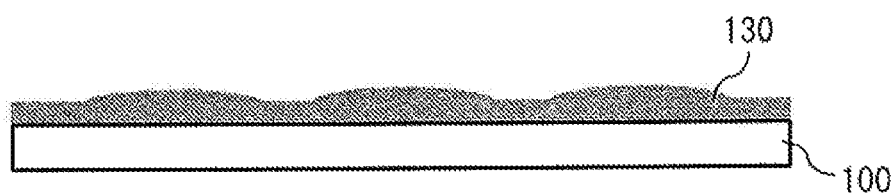

Incidentally, where recoating is performed by a plural number of times, a layer painted already dissolves into ink recoated subsequently. For example, as depicted in FIGS. 16A and 16B, after a first layer 110 is applied to a base material 100, the first layer 110 is dried. Then, if a second layer 120 is applied to the first layer 110, then part of the first layer 110 will dissolve, for example, as depicted in FIG. 16C and will be mixed with the second layer 120. At this time, such dissolution of the first layer 110 locally occurs only in the proximity of a location at which a liquid droplet of ink discharged upon formation of the second layer 120 lands. If the second layer 120 is dried in the state in which the dissolution locally occurs only in the proximity of the location at which a liquid droplet of ink lands in this manner, then an organic material layer 130 is formed whose film thickness is locally small at the location at which the liquid droplet of the ink has landed as depicted, for example, in FIG. 16D. Especially, where a line bank in which ink can flow between pixels is used, the film thickness unevenness will be viewed as streaky luminance unevenness over a plurality of pixels.

Meanwhile, in the present embodiment, the organic material layer 24Bi is applied after an insolubilization process that provides a change to the structure of molecules included in the organic material layer 24Ai is performed for the applied organic material layer 24Ai. Consequently, the organic material layer 24Ai becomes less likely to dissolve by the organic material layer 24Bi. As a result, streaky luminance unevenness can be suppressed.

Further, in the present embodiment, where the organic material layer 24Ai and the organic material layer 24Bi are configured from common ink, when the organic material layer 24Bi is applied, the labor for exchanging an ink tank of the ink jet printer can be omitted. As a result, increase of the manufacturing cost of the organic electroluminescent panel 10 can be suppressed low.

Further, it is assumed that, in the present embodiment, where the organic material layer 24Ai contains a material having a crosslinkable group in at least one of the organic light emitting material 24M and a component other than the organic light emitting material 24M, a process for urging a polymerization reaction of the crosslinkable group is used as the insolubilization process. In this case, it is possible to provide a great difference in solubility into solvent across a reaction (insolubilizing reaction) that occurs by irradiation of at least one of heat and an active energy ray. Therefore, the organic material layer 24Ai can be made extremely less liable to be dissolved by the organic material layer 24Bi. Accordingly, streaky luminance unevenness can be suppressed with certainty.

Further, it is assumed that, in the present embodiment, where the organic material layer 24Ai contains a material having a thermally dissociable soluble group in at least one of the organic light emitting material 24M and a component other than the organic light emitting material 24M, a process for urging a polymerization reaction of the thermally dissociable soluble group is used as the insolubilization process. In this case, an insolubilization process can be performed with comparatively low energy. Consequently, occurrence of an unintended secondary reaction can be suppressed, and streaky luminance unevenness can be suppressed without having a bad influence on the organic light emitting material 24M.

Further, it is assumed that, in the present embodiment, where the organic material layer 24Ai contains a material having a removable protecting group in at least one of the organic light emitting material 24M and a component other than the organic light emitting material 24M, a process for urging a polymerization reaction of the removable protecting group is used as the insolubilization process. In this case, an insolubilization process can be performed with comparatively low energy. Consequently, occurrence of an unintended secondary reaction can be suppressed, and streaky luminance unevenness can be suppressed without having a bad influence on the organic light emitting material 24M.

Further, in the present embodiment, where the organic material layer 24Ai and the organic material layer 24Bi are recoated in a gap (in a grooved portion 16) between two line banks extending in parallel to each other at the application step, the positioning accuracy of the ink jet device can be made low in comparison with an alternative case in which the organic material layer 24Ai and the organic material layer 24Bi are recoated for each sub-pixel 12. Accordingly, the organic electroluminescent panel 10 in which streaky luminance unevenness is suppressed can be manufactured at a low cost.

Further, in the present embodiment, where the gap (grooved portion 16) between two line banks parallel to each other has a magnitude equal to or smaller than 50 μm, streaky luminance unevenness can be suppressed by performing recoating in the present embodiment.

Further, in the present embodiment, where the gap (grooved portion 16) between two line banks parallel to each other is sized such that, where the RGB sub-pixels are arrayed in a stripe array, the definition is equal to or higher than 150 ppi, streaky luminance unevenness can be suppressed by performing recoating in the present embodiment.

<Modifications>

In the following, modifications to the manufacturing method for the organic electroluminescent panel 10 of the embodiment described above are described.

[Modification A]

In the organic electroluminescent panel 10 of the embodiment described above, the electron transport layer 25 may be configured, for example, from a plurality of electron transport layers stacked on each other.

Figure 17:
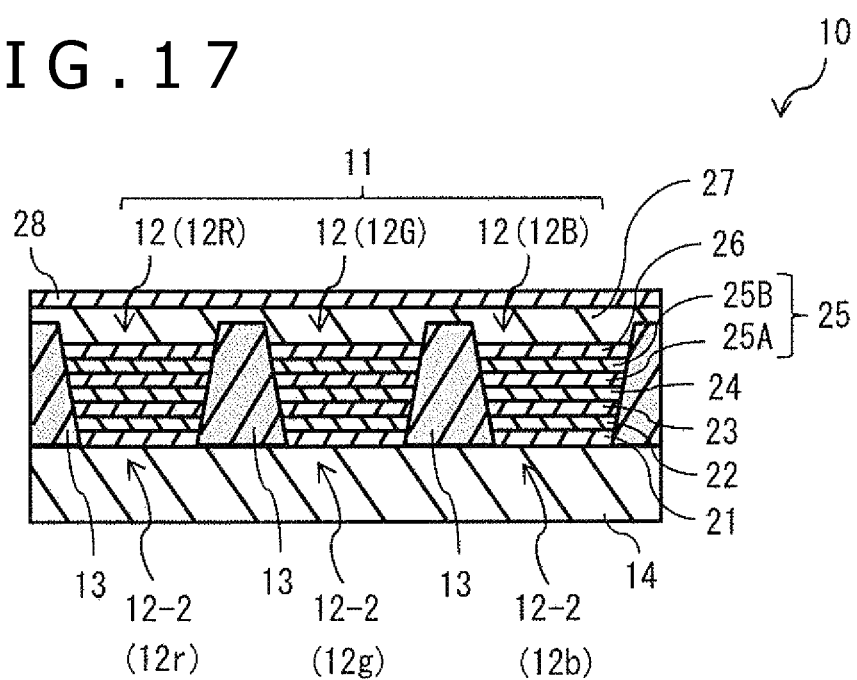
FIG. 17 is a sectional view taken along line A-A of FIG. 1 depicting a modification to the sectional configuration of the organic electroluminescent panel of FIG. 1.

The electron transport layer 25 is configured, for example, by stacking an electron transport layer 25A and another electron transport layer 25B having principal components common to each other and stacked in this order from the organic light emitting layer 24 side as depicted in FIG. 17. The electron transport layer 25 includes, for example, an electron transport layer 25A and an electron transport layer 25B having a common principal component and stacked on each other. Both the electron transport layer 25A and the electron transport layer 25B are applied films. Both the electron transport layer 25A and the electron transport layer 25B are formed by applying and drying solution in which the electron transporting material 25M is a principal component of solute. Both the electron transport layer 25A and the electron transport layer 25 are configured including the electron transporting material 25M as a principal component. Both the electron transport layer 25A and the electron transport layer 25B are formed, for example, by applying ink common between them.

In at least one of the electron transport layer 25A and the electron transport layer 25B (particularly in the electron transport layer 25A), for example, at least one of the electron transporting material 25M and a component other than the electron transporting material 25M has an insolubilizing function (material having an insolubilizing group). Accordingly, the layer having the insolubilizing function from between the electron transport layer 25A and the electron transport layer 25B is an organic light emitting layer for which an insolubilization process has been performed.

Figure 18:
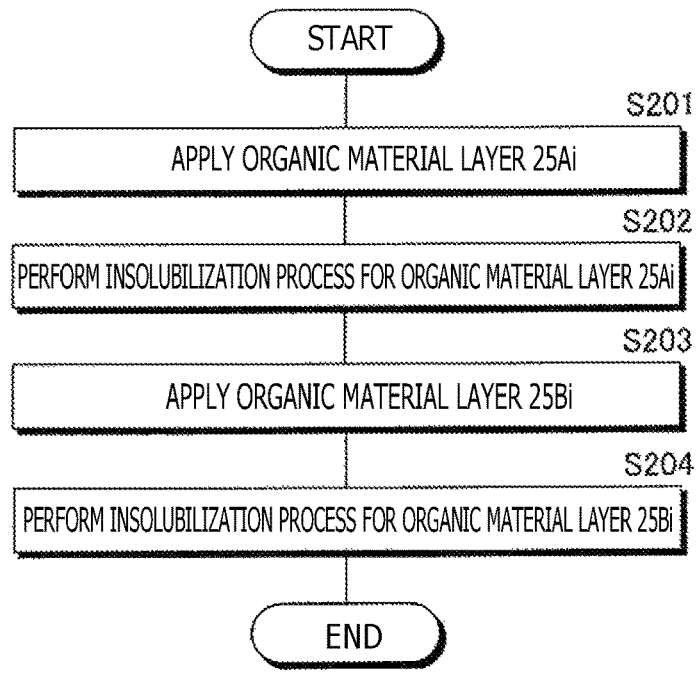
FIG. 18 is a view depicting an example of a manufacturing procedure of the organic electroluminescent panel of FIG. 17.

Now, a manufacturing method for the organic electroluminescent panel 10 is described. FIG. 18 depicts an example of a manufacturing procedure of the organic electroluminescent panel 10. In the following, description is given beginning with a step after the anode 21 is formed.

For example, after liquid droplets of ink are discharged using an ink jet device, the ink after discharged is dried first to form a hole injection layer 22, a hole transport layer 23 and an organic light emitting layer 24. Then, liquid droplets of ink are discharged, for example, using an ink jet device, to recoat a liquid organic material layer 25Ai and a liquid organic material layer 25Bi that have a common principal component. Both the organic material layer 25Ai and the organic material layer 25Bi are liquid organic material layers in which the electron transporting material 25M is a principal component of solute. Both the organic material layer 25Ai and the organic material layer 25Bi are configured containing the electron transporting material 25M as a principal component. Both the organic material layer 25Ai and the organic material layer 25Bi are configured from common ink. In at least the organic material layer 25Ai from between the organic material layer 25Ai and the organic material layer 25Bi, at least one of the electron transporting material 25M and a component other than the electron transporting material 25M contains a material having an insolubilizing group.

In particular, a liquid organic material layer 25Ai that is a raw material of the electron transport layer 25A is applied in the grooved portion 16 (step S201). At this time, for example, from an ink jet device, liquid droplets LQ are dropped into the grooved portion 16 at discharge intervals D2 equal to or greater than twice the diameter R1 of the liquid droplets LQ. In other words, the discharge interval D2 of liquid droplets is equal to or greater than twice the diameter R1 of the liquid droplets LQ. The discharge interval D2 is, for example, an equal interval in regard to all liquid droplets LQ dropped in the grooved portion 16. It is to be noted that the discharge interval D2 may partially increase or decrease, for example, in the grooved portion 16.

Then, an insolubilization process is performed for the organic material layer 25Ai to provide a change to the structure of molecules included in the organic material layer 25Ai (step S202). Consequently, the solvent included in the organic material layer 25Ai is volatilized, and the organic material layer 25Ai is insolubilized by a change of the structure of molecules included in the organic material layer 25Ai. As a result, an electron transport layer 25A is formed. It is to be noted that, in the insolubilization process at step S202, a change may be provided to the structure of molecules included in the organic material layer 25Ai simultaneously with the volatilization of the solvent included in the organic material layer 25Ai. Alternatively, in the insolubilization process at step S202, a change may be provided to the structure of molecules included in the organic material layer 25Ai after the solvent included in the organic material layer 25Ai is volatilized.

Then, a liquid organic material layer 25Bi that is a raw material of the electron transport layer 25B is applied to the grooved portion 16 (step S203). At this time, for example, from an ink jet device, liquid droplets LQ are dropped into the grooved portion 16 at discharge intervals D2 equal to or greater than twice the diameter R1 of the liquid droplets LQ. In other words, the discharge interval D2 of the liquid droplets is equal to or greater than twice the diameter R1 of the liquid droplets LQ. The discharge interval D2 is an equal interval in regard to all liquid droplets LQ dropped in the grooved portion 16. It is to be noted that the discharge interval D2 may partially increase or decrease, for example, in the grooved portion 16.

Then, an insolubilization process is performed for the organic material layer 25Bi (step S204). At this time, if the organic material layer 25Bi contains a material having an insolubilizing group, then a change is provided to the structure of molecules included in the organic material layer 25Bi by an insolubilization process. As a result, the solvent included in the organic material layer 25Bi is volatilized, and the organic material layer 25Bi is insolubilized by a change of the structure of molecules included in the organic material layer 25Bi. As a result, an electron transport layer 25B is formed. Where the organic material layer 25Bi does not contain a material having an insolubilizing group, the solvent contained in the organic material layer 25Bi is volatilized by the insolubilization process, and consequently, the organic material layer 25Bi is insolubilized. As a result, the electron transport layer 25B is formed. It is to be noted that, in the insolubilization process at step S204, a change may be provided to the structure of molecules included in the organic material layer 25Bi simultaneously with the volatilization of the solvent included in the organic material layer 25Bi. Alternatively, in the insolubilization process at step S204, a change may be provided to the structure of molecules included in the organic material layer 25Bi after the solvent included in the organic material layer 25Bi is volatilized. Where the organic material layer 25Bi does not contain a material having an insolubilizing group, a volatilization process is performed for the organic material layer 25Bi in place of the insolubilization process. As a result, an electron transport layer 25B is formed.

Then, after liquid droplets of ink are discharged, for example, using an ink jet device, the ink after discharged is dried to form an electron injection layer 26. Then, a cathode 27 and a sealing layer 28 are formed in this order on the electron injection layer 26. An organic electroluminescent panel 10 having an organic electroluminescent element 12-2 for each sub-pixel 12 is manufactured in this manner.

Now, advantageous effects of the manufacturing method for the organic electroluminescent panel 10 according to the present modification are described.

In the present modification, the organic material layer 25Bi is applied after an insolubilization process that provides a change to the structure of molecules included in the organic material layer 25Ai is performed for the applied organic material layer 25Ai. Consequently, the organic material layer 25Ai becomes less likely to dissolve by the organic material layer 25Bi. As a result, streaky luminance unevenness can be suppressed.

Further, in the present modification, where the organic material layer 25Ai and the organic material layer 25Bi are configured from common ink, when the organic material layer 25Bi is applied, the labor for exchanging an ink tank of the ink jet printer can be omitted. As a result, increase of the manufacturing cost of the organic electroluminescent panel 10 can be suppressed low.

Further, it is assumed that, in the present modification, where the organic material layer 25Ai contains a material having a crosslinkable group in at least one of the electron transporting material 25M and a component other than the electron transporting material 25M, a process for urging a polymerization reaction of the crosslinkable group is used as the insolubilization process. In this case, it is possible to provide a great difference in solubility into solvent across a reaction (insolubilizing reaction) that occurs by irradiation of at least one of heat and an active energy ray. Therefore, the organic material layer 25Ai can be made extremely less liable to be dissolved by the organic material layer 25Bi. Accordingly, streaky luminance unevenness can be suppressed with certainty.

Further, it is assumed that, in the present modification, where the organic material layer 25Ai contains a material having a thermally dissociable soluble group in at least one of the electron transporting material 25M and a component other than the electron transporting material 25M, a process for urging a polymerization reaction of the thermally dissociable soluble group is used as the insolubilization process. In this case, an insolubilization process can be performed with comparatively low energy. Consequently, occurrence of an unintended secondary reaction can be suppressed, and therefore, streaky luminance unevenness can be suppressed without having a bad influence on the electron transporting material 25M.

Further, it is assumed that, in the present modification, where the organic material layer 25Ai contains a material having a removable protecting group in at least one of the electron transporting material 25M and a component other than the electron transporting material 25M, a process for urging a polymerization reaction of the removable protecting group is used as the insolubilization process. In this case, an insolubilization process can be performed with comparatively low energy. Consequently, occurrence of an unintended secondary reaction can be suppressed, and therefore, streaky luminance unevenness can be suppressed without having a bad influence on the electron transporting material 25M.

Further, in the present modification, where the organic material layer 25Ai and the organic material layer 25Bi are recoated in a gap (in a grooved portion 16) between two line banks extending in parallel to each other at the application step, the positioning accuracy of the ink jet device can be made low in comparison with an alternative case in which the organic material layer 25Ai and the organic material layer 25Bi are recoated for each sub-pixel 12. Accordingly, the organic electroluminescent panel 10 in which streaky luminance unevenness is suppressed can be manufactured at a low cost.

Further, in the present modification, where the gap (grooved portion 16) between two line banks parallel to each other has a magnitude equal to or smaller than 50 μm, streaky luminance unevenness can be suppressed by performing recoating in the present modification.

Further, in the present modification, where the gap (grooved portion 16) between two line banks parallel to each other is sized such that, where the RGB sub-pixels are arrayed in a stripe array, the definition is equal to or higher than 150 ppi, streaky luminance unevenness can be suppressed by performing recoating in the present modification.

[Modification B]

In the organic electroluminescent panel 10 of the embodiment described above, the hole transport layer 23 may be configured, for example, a plurality of hole transport layers stacked on each other.

Figure 19:
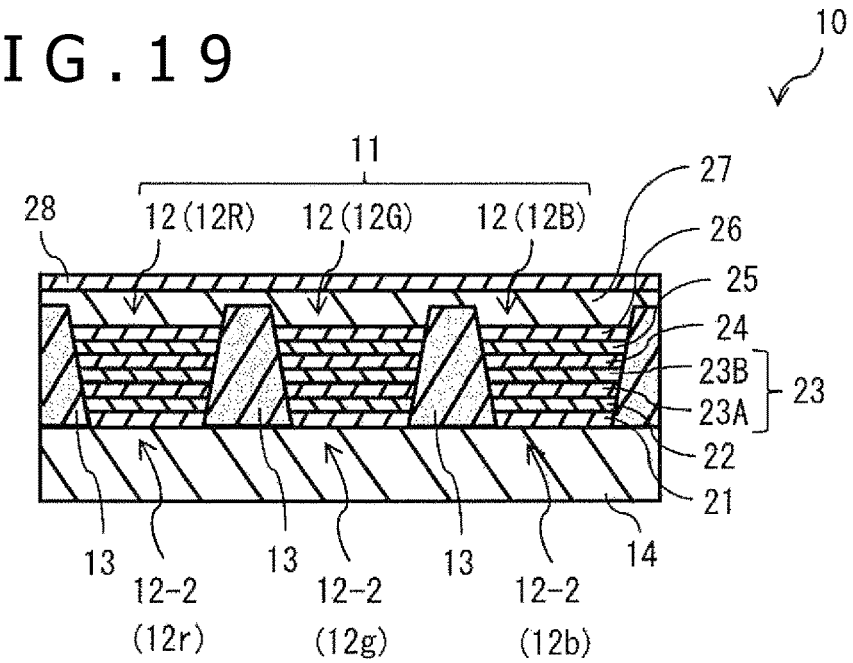
FIG. 19 is a sectional view taken along line A-A of FIG. 1 depicting a modification to the sectional configuration of the organic electroluminescent panel of FIG. 1.

The hole transport layer 23 is a stacked layer of a hole transport layer 23A and another hole transport layer 23B having a common principal component and stacked in this order from the anode 21 side or the hole injection layer 22 side, for example, as depicted in FIG. 19. The hole transport layer 23 includes, for example, a hole transport layer 23A and a hole transport layer 23B stacked on each other and having a common principal component. Both the hole transport layer 23A and the hole transport layer 23B are applied films. Both the hole transport layer 23A and the hole transport layer 23B are formed by application and drying of solution in which the hole transporting material 23M is a principal component of solute. Both the hole transport layer 23A and the hole transport layer 23B are configured including the hole transporting material 23M as a principal component. Both the hole transport layer 23A and the hole transport layer 23B are formed, for example, by applying common ink.

At least one of the hole transport layer 23A and the hole transport layer 23B (particularly, the hole transport layer 23A) has an insolubilizing function (material having an insolubilizing group), for example, in at least one of the hole transporting material 23M and a component other than the hole transporting material 23M. Accordingly, the layer that has an insolubilizing function from between the hole transport layer 23A and the hole transport layer 23B is an organic light emitting layer for which an insolubilization process has been performed.

Figure 20:
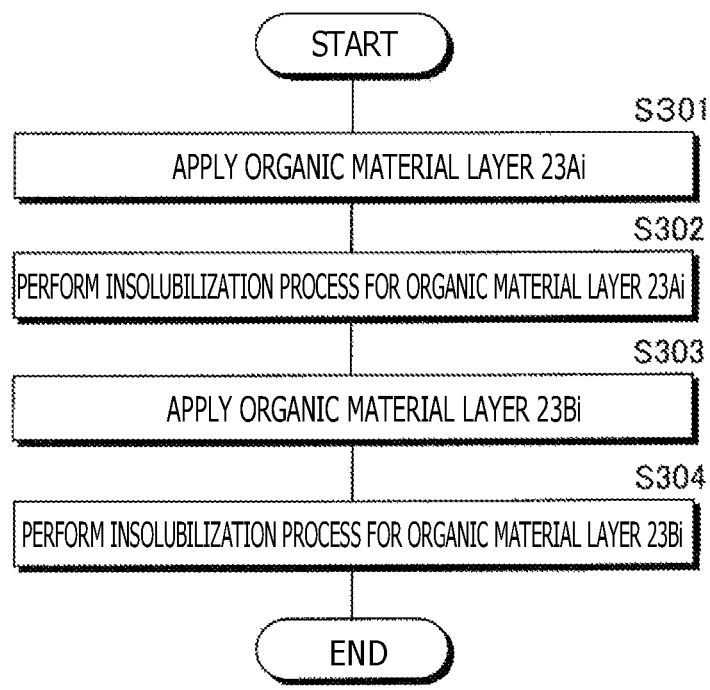
FIG. 20 is a view depicting an example of a manufacturing procedure of the organic electroluminescent panel of FIG. 19.

Now, a manufacturing method for the organic electroluminescent panel 10 is described. FIG. 20 depicts an example of a manufacturing procedure of the organic electroluminescent panel 10. In the following, description is given beginning with a step after the anode 21 is formed.

For example, after liquid droplets of ink are discharged using an ink jet device, the ink after discharged is dried first to form a hole injection layer 22. Then, liquid droplets of ink are discharged, for example, using an ink jet device, to recoat a liquid organic material layer 23Ai and a liquid organic material layer 23Bi that have a common principal component. Both the organic material layer 23Ai and the organic material layer 23Bi are liquid organic material layers in which the hole transporting material 23M is a principal component of solute. Both the organic material layer 23Ai and the organic material layer 23Bi are configured containing the hole transporting material 23M as a principal component. Both the organic material layer 23Ai and the organic material layer 23Bi are configured from common ink. In at least the organic material layer 23Ai from between the organic material layer 23Ai and the organic material layer 23Bi, at least one of the hole transporting material 23M and a component other than the hole transporting material 23M contains a material having an insolubilizing group.

In particular, a liquid organic material layer 23Ai that is a raw material of the hole transport layer 23A is applied in the grooved portion 16 (step S301). At this time, for example, from an ink jet device, liquid droplets LQ are dropped into the grooved portion 16 at discharge intervals D2 equal to or greater than twice the diameter R1 of the liquid droplets LQ. In other words, the discharge interval D2 of liquid droplets is equal to or greater than twice the diameter R1 of the liquid droplets LQ. The discharge interval D2 is, for example, an equal interval in regard to all liquid droplets LQ dropped in the grooved portion 16. It is to be noted that the discharge interval D2 may partially increase or decrease, for example, in the grooved portion 16.

Then, an insolubilization process is performed for the organic material layer 23Ai to provide a change to the structure of molecules included in the organic material layer 23Ai (step S302). Consequently, the solvent included in the organic material layer 23Ai is volatilized, and the organic material layer 23Ai is insolubilized by a change of the structure of molecules included in the organic material layer 23Ai. As a result, a hole transport layer 23A is formed. It is to be noted that, in the insolubilization process at step S302, a change may be provided to the structure of molecules included in the organic material layer 23Ai simultaneously with the volatilization of the solvent included in the organic material layer 23Ai. Alternatively, in the insolubilization process at step S302, a change may be provided to the structure of molecules included in the organic material layer 23Ai after the solvent included in the organic material layer 23Ai is volatilized.

Then, a liquid organic material layer 23Bi that is a raw material of the hole transport layer 23B is applied in the grooved portion 16 (step S303). At this time, for example, from an ink jet device, liquid droplets LQ are dropped into the grooved portion 16 at discharge intervals D2 equal to or greater than twice the diameter R1 of the liquid droplets LQ. In other words, the discharge interval D2 of liquid droplets is equal to or greater than twice the diameter R1 of the liquid droplets LQ. The discharge interval D2 is an equal interval in regard to all liquid droplets LQ dropped in the grooved portion 16. It is to be noted that the discharge interval D2 may partially increase or decrease, for example, in the grooved portion 16.

Then, an insolubilization process is performed for the organic material layer 23Bi (step S304). At this time, if the organic material layer 23Bi contains a material having an insolubilizing group, then a change is provided to the structure of molecules included in the organic material layer 23Bi by an insolubilization process. As a result, the solvent included in the organic material layer 23Bi is volatilized, and the organic material layer 23Bi is insolubilized by a change of the structure of molecules included in the organic material layer 23Bi. As a result, a hole transport layer 23B is formed. It is to be noted that, in the insolubilization process at step S304, a change may be provided to the structure of molecules included in the organic material layer 23Bi simultaneously with the volatilization of the solvent included in the organic material layer 23Bi. Alternatively, in the insolubilization process at step S304, a change may be provided to the structure of molecules included in the organic material layer 23Bi after the solvent included in the organic material layer 23Bi is volatilized. Where the organic material layer 23Bi does not contain a material having an insolubilizing group, a volatilization process is performed for the organic material layer 23Bi in place of the insolubilization process. As a result, a hole transport layer 23B is formed.

Then, after liquid droplets of ink are discharged, for example, using an ink jet device, the ink after discharged is dried to form an organic light emitting layer 24, an electron transport layer 25 and an electron injection layer 26. Then, a cathode 27 and a sealing layer 28 are formed in this order on the electron injection layer 26. An organic electroluminescent panel 10 having an organic electroluminescent element 12-2 for each sub-pixel 12 is manufactured in this manner.

Now, advantageous effects of the manufacturing method for the organic electroluminescent panel 10 according to the present modification are described.

In the present modification, the organic material layer 23Bi is applied after an insolubilization process that provides a change to the structure of molecules included in the organic material layer 23Ai is performed for the applied organic material layer 23Ai. Consequently, the organic material layer 23Ai becomes less likely to dissolve by the organic material layer 23Bi. As a result, streaky luminance unevenness can be suppressed.

Further, in the present modification, where the organic material layer 23Ai and the organic material layer 23Bi are configured from common ink, when the organic material layer 23Bi is applied, the labor for exchanging an ink tank of the ink jet printer can be omitted. As a result, increase of the manufacturing cost of the organic electroluminescent panel 10 can be suppressed low.

Further, it is assumed that, in the present modification, where the organic material layer 23Ai contains a material having a crosslinkable group in at least one of the hole transporting material 23M and a component other than the hole transporting material 23M, a process for urging a polymerization reaction of the crosslinkable group is used as the insolubilization process. In this case, it is possible to provide a great difference in solubility into solvent across a reaction (insolubilizing reaction) that occurs by irradiation of at least one of heat and an active energy ray. Therefore, the organic material layer 23Ai can be made extremely less liable to be dissolved by the organic material layer 23Bi. Accordingly, streaky luminance unevenness can be suppressed with certainty.

Further, it is assumed that, in the present modification, where the organic material layer 23Ai contains a material having a thermally dissociable soluble group in at least one of the hole transporting material 23M and a component other than the hole transporting material 23M, a process for urging a polymerization reaction of the thermally dissociable soluble group is used as the insolubilization process. In this case, an insolubilization process can be performed with comparatively low energy. Consequently, occurrence of an unintended secondary reaction can be suppressed, and therefore, streaky luminance unevenness can be suppressed without having a bad influence on the hole transporting material 23M.

Further, it is assumed that, in the present modification, where the organic material layer 23Ai contains a material having a removable protecting group in at least one of the hole transporting material 23M and a component other than the hole transporting material 23M, a process for urging a polymerization reaction of the removable protecting group is used as the insolubilization process. In this case, an insolubilization process can be performed with comparatively low energy. Consequently, occurrence of an unintended secondary reaction can be suppressed, and therefore, streaky luminance unevenness can be suppressed without having a bad influence on the hole transporting material 23M.

Further, in the present modification, where the organic material layer 23Ai and the organic material layer 23Bi are recoated in a gap (in a grooved portion 16) between two line banks extending in parallel to each other at the application step, the positioning accuracy of the ink jet device can be made low in comparison with an alternative case in which the organic material layer 23Ai and the organic material layer 23Bi are recoated for each sub-pixel 12. Accordingly, the organic electroluminescent panel 10 in which streaky luminance unevenness is suppressed can be manufactured at a low cost.

Further, in the present modification, where the gap (grooved portion 16) between two line banks parallel to each other has a magnitude equal to or smaller than 50 µm, streaky luminance unevenness can be suppressed by performing recoating in the present modification.

Further, in the present modification, where the gap (grooved portion 16) between two line banks parallel to each other is sized such that, where the RGB sub-pixels are arrayed in a stripe array, the definition is equal to or higher than 150 ppi, streaky luminance unevenness can be suppressed by performing recoating in the present modification. Generally, as the definition increases, also the amount of ink that can be held in the gap decreases. Accordingly, if it is intended to obtain a necessary film thickness by a single printing, a high density of ink is required. However, it is difficult to excessively increase the ink density from the point of view of printable physical properties (viscosity and so forth) as described hereinabove. Therefore, organic material is recoated by a plural number of times such that, even in a panel having a high definition, streaky luminance unevenness can be suppressed while the organic material layer is formed thick.

<Others>

Incidentally, it is assumed that, in the manufacturing process of an organic electroluminescent element 12-2, at least one layer from among the hole transport layer 23, the organic light emitting layer 24 and the electron transport layer 25 is formed thick. At this time, in order to dry the layer formed thick, it is necessary to set a rather long drying time period or to set a high drying temperature in comparison with the other layers formed thin. However, it is not easy to fully dry the layer formed thick, and a lower portion of the layer formed thick is sometimes dried insufficiently. In this case, the solvent remaining in the layer formed thick is likely to give rise to such a problem that deterioration of the organic electroluminescent element 12-2 is promoted.

However, in the embodiment described hereinabove, the organic light emitting layer 24 is configured from a plurality of organic light emitting layers (for example, an organic light emitting layer 24A and another organic light emitting layer 24B) and is formed by recoating of the plurality of organic light emitting layers (for example, the organic light emitting layer 24A and the organic light emitting layer 24B). Consequently, even where the organic light emitting layer 24 is formed thick, the plurality of recoated organic light emitting layers can be dried one by one layer. As a result, the solvent remaining in the organic light emitting layer 24 can be reduced very readily in comparison with an alternative case in which the organic light emitting layer 24 is dried by a drying step performed once. Accordingly, such a problem that deterioration of the organic electroluminescent element 12-2 is promoted can be reduced.

Meanwhile, in the modification A described hereinabove, the electron transport layer 25 is configured from a plurality of electron transport layers (for example, an electron transport layer 25A and another electron transport layer 25B) and is formed by recoating of the plurality of electron transport layers (for example, the electron transport layer 25A and the electron transport layer 25B). Consequently, even where the electron transport layer 25 is formed thick, the plurality of recoated electron transport layers can be dried one by one layer. As a result, the solvent remaining in the electron transport layer 25 can be reduced very readily in comparison with an alternative case in which the electron transport layer 25 is dried by a drying step performed once. Accordingly, such a problem that deterioration of the organic electroluminescent element 12-2 is promoted can be reduced.

Meanwhile, in the modification B described hereinabove, the hole transport layer 23 is configured from a plurality of hole transport layers (for example, a hole transport layer 23A and another hole transport layer 23B) and is formed by recoating of the plurality of hole transport layers (for example, the hole transport layer 23A and the hole transport layer 23B). Consequently, even where the hole transport layer 23 is formed thick, the plurality of recoated hole transport layers can be dried one by one layer. As a result, the solvent remaining in the hole transport layer 23 can be reduced very readily in comparison with an alternative case in which the hole transport layer 23 is dried by a drying step performed once. Accordingly, such a problem that deterioration of the organic electroluminescent element 12-2 is promoted can be reduced.

Although the present disclosure has been described in connection with the embodiment and the modifications, the present disclosure is not limited to the embodiment and so forth but can be modified in various manners. For example, while, in the embodiment and the modifications A and B, a plurality of line banks 13 and a plurality of banks 15 are provided on a substrate 14, one pixel bank may be provided for each sub-pixel 12 in place of them.

It is to be noted that the advantageous effects described herein are illustrative to the last. The advantageous effects of the present disclosure are not limited to those described herein. The present disclosure may have advantageous effects other than those described herein.

Further, the present disclosure can take, for example, such configurations as described below.

(1)

A manufacturing method for an organic electroluminescent panel that includes an organic electroluminescent element for each sub-pixel, the manufacturing method including:

an application step of recoating a first organic material layer and a second organic material layer, which include principal components common to each other, to manufacture the organic electroluminescent element, in which at the application step, after the first organic material layer is applied, an insolubilization process is performed for the first organic material layer to provide a change to a structure of molecules included in the first organic material layer, and the second organic material layer is applied to the first organic material layer after the insolubilization process is performed.

(2)

The manufacturing method for an organic electroluminescent panel according to (1), in which the organic electroluminescent element includes a hole transport layer, an organic light emitting layer and an electron transport layer, and the hole transport layer, the organic light emitting layer or the electron transport layer is formed by performing the application step.

(3)

The manufacturing method for an organic electroluminescent panel according to (1) or (2), in which the first organic material layer and the second organic material layer are configured from ink common to each other.

(4)

The manufacturing method for an organic electroluminescent panel according to any one of (1) to (3), in which, in the first organic material layer, at least one of the principal component or a component other than the principal component includes a material having a thermal dissociable soluble group, a crosslinkable group or a removable protecting group, and as the insolubilization process, a process for accelerating a thermal dissociation reaction of the thermal dissociable soluble group, a polymerization reaction of the crosslinkable group or a desorption reaction of the removable protecting group is used.

(5)

The manufacturing method for an organic electroluminescent panel according to any one of (1) to (4), in which, at the application step, the first organic material layer and the second organic material layer are recoated in a gap between two line banks parallel to each other.

(6)

The manufacturing method for an organic electroluminescent panel according to (5), in which the gap has a size of 50 μm or less.

(7)

The manufacturing method for an organic electroluminescent panel according to (5), in which the gap has such a size that a definition is 150 ppi or more where the sub-pixels of RGB are arrayed in a stripe array.

(8)

The manufacturing method for an organic electroluminescent panel according to any one of (5) to (7), in which the first organic material layer and the second organic material layer are recoated by discharging of liquid droplets of ink using an ink jet device, and a discharge interval between the liquid droplets is two times or more of a diameter of the droplets.

(9)

An organic electroluminescent panel including:

an organic electroluminescent element provided for each sub-pixel, in which the organic electroluminescent element includes a hole transport layer, an organic light emitting layer and an electron transport layer, and the hole transport layer, the organic light emitting layer or the electron transport layer includes a first organic material layer and a second organic material layer that are stacked on each other and whose principal components are common to each other.

(10)

The organic electroluminescent panel according to (9), in which at least one of the first organic material layer and the second organic material layer includes a material having a thermal dissociable soluble group, a crosslinkable group or a removable protecting group.

The present disclosure contains subject matter related to that disclosed in Japanese Priority Patent Application JP 2016-223363 filed in the Japan Patent Office on Nov. 16, 2016, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A manufacturing method for an organic electroluminescent panel that includes an organic electroluminescent element for each sub-pixel, the manufacturing method comprising:

recoating a first organic material layer and a second organic material layer to manufacture the organic electroluminescent element, wherein the first organic material layer and the second organic material layer include common principal components, wherein, after the first organic material layer is recoated, an insolubilization process is performed for the first organic material layer to provide a change to a structure of molecules included in the first organic material layer, and the second organic material layer is recoated to the first organic material layer after the insolubilization process is performed, forming a plurality of line banks and a plurality of banks on a substrate, wherein each line bank of the plurality of line banks extends in a row direction on the substrate and is parallel to each other, wherein each bank of the plurality of banks extends in a column direction on the substrate such that the each bank of the plurality of banks connects end portions of at least two line banks of the plurality of line banks, and wherein the first organic material layer and the second organic material layer are recoated in a gap between two line banks of the plurality of line banks.

2. The manufacturing method for the organic electroluminescent panel according to claim 1, wherein the organic electroluminescent element includes a hole transport layer, an organic light emitting layer, and an electron transport layer, and wherein the hole transport layer, the organic light emitting layer or the electron transport layer is formed by the recoating.

3. The manufacturing method for the organic electroluminescent panel according to claim 2, wherein the hole transport layer, the first organic material layer, the second organic material layer, and the electron transport layer are stacked on the substrate of the organic electroluminescent element, when the organic light emitting layer comprises the first organic material layer, and the second organic material layer.

4. The manufacturing method for the organic electroluminescent panel according to claim 1, wherein the first organic material layer and the second organic material layer are configured from ink common to each other.

5. The manufacturing method for the organic electroluminescent panel according to claim 1,
wherein, in the first organic material layer, at least one of a principal component or a component other than the principal component includes a material having a thermal dissociable soluble group, a crosslinkable group or a removable protecting group, and
as the insolubilization process, a process for accelerating a thermal dissociation reaction of the thermal dissociable soluble group, a polymerization reaction of the crosslinkable group or a desorption reaction of the removable protecting group is used.

6. The manufacturing method for the organic electroluminescent panel according to claim 1, wherein the gap has a size of 50 μm or less than 50 μm.

7. The manufacturing method for the organic electroluminescent panel according to claim 1, wherein the gap has such a size that a definition is 150 ppi or more than 150 ppi, where sub-pixels are arrayed in a stripe array.

8. The manufacturing method for the organic electroluminescent panel according to claim 1,
wherein the first organic material layer and the second organic material layer are recoated by discharging of liquid droplets of ink using an ink jet device, and
wherein a discharge interval between the liquid droplets is two times or more of a diameter of the liquid droplets.

9. The manufacturing method for the organic electroluminescent panel according to claim 1, wherein the organic electroluminescent panel further comprises a region surrounded by two line banks of the plurality of line banks and the plurality of banks that are at opposite ends of the two line banks, and wherein the region forms a grooved portion.

10. The manufacturing method for the organic electroluminescent panel according to claim 9, wherein the organic electroluminescent element of each sub-pixel with a same color is arranged in the grooved portion.

11. An organic electroluminescent panel, comprising:
an organic electroluminescent element provided for each sub-pixel,
wherein the organic electroluminescent element includes a hole transport layer, an organic light emitting layer, and an electron transport layer, and at least one of the hole transport layer, the organic light emitting layer, or the electron transport layer includes a first organic material layer and a second organic material layer that are stacked on each other, and wherein the first organic material layer and the second organic material layer include common principal components; and
a plurality of line banks and a plurality of banks on a substrate,
wherein each line bank of the plurality of line banks extends in a row direction on the substrate and is parallel to each other,
wherein each bank of the plurality of banks extends in a column direction on the substrate such that the each bank of the plurality of banks connects end portions of at least two line banks of the plurality of line banks, and
wherein the first organic material layer and the second organic material layer are recoated in a gap between two line banks of the plurality of line banks.

12. The organic electroluminescent panel according to claim 11, wherein at least one of the first organic material layer and the second organic material layer includes a material having a thermal dissociable soluble group, a crosslinkable group or a removable protecting group.

* * * * *